United States Patent [19]
Sandhage

[11] Patent Number: 6,153,561
[45] Date of Patent: *Nov. 28, 2000

[54] METHOD FOR OXYGENATING OXIDE SUPERCONDUCTIVE MATERIALS

[75] Inventor: Kenneth H. Sandhage, Upper Arlington, Ohio

[73] Assignee: The Ohio State University, Columbus, Ohio

[*] Notice: This patent issued on a continued prosecution application filed under 37 CFR 1.53(d), and is subject to the twenty year patent term provisions of 35 U.S.C. 154(a)(2).

[21] Appl. No.: 08/713,660

[22] Filed: Sep. 13, 1996

[51] Int. Cl.$^7$ ............... H01L 39/24; B05D 5/12

[52] U.S. Cl. ............ 505/500; 505/480; 505/482; 505/742

[58] Field of Search .................... 505/500, 501, 505/742, 482, 480; 427/62

[56] References Cited

U.S. PATENT DOCUMENTS

| | | | |
|---|---|---|---|
| 5,021,396 | 6/1991 | Fujita et al. ................... | 505/1 |
| 5,034,373 | 7/1991 | Smith et al. ................... | 505/1 |
| 5,086,034 | 2/1992 | Balachandran et al. ....... | 505/1 |
| 5,096,882 | 3/1992 | Kato et al. .................... | 505/1 |
| 5,203,897 | 4/1993 | Powers et al. ............... | 65/3.12 |
| 5,259,885 | 11/1993 | Sandhage ...................... | 148/282 |
| 5,318,725 | 6/1994 | Sandhage ...................... | 252/520 |
| 5,374,611 | 12/1994 | Dabrowski et al. .......... | 505/500 |
| 5,376,623 | 12/1994 | Tsai et al. ..................... | 505/492 |
| 5,447,291 | 9/1995 | Sandhage ...................... | 264/60 |
| 5,472,527 | 12/1995 | Otto et al. ..................... | 505/431 |
| 5,509,101 | 4/1996 | Gilliland et al. ............. | 385/142 |
| 5,705,457 | 1/1998 | Tamura et al. ................ | 505/482 |

OTHER PUBLICATIONS

Shimakawa et al,Jpn. J. Appl. Phys. 27(6) pp. L1071–1073, Jun. 1988.

Bormann, et al., Stability limits of the perovskite structure in the Y–Ba–Cu–O System, *Appl. Phys. Lett.* vol. 54, pp. 2148–2150, May 1989.

Lindemer, et al., Experimental and Thermodynamic Study of Nonstoichiometry in ($YBa_2Cu_3O_{7-x}$), *J. Am. Ceram. Soc.*, vol. 72, pp. 1775–1788, 1989.

Jorgensen, et al., Oxygen ordering and the orthorhombic–to–tetragonal phase transition in $YBa_2Cu_3O_{7-x}$, *Physical Review B*, vol. 36, No. 7, pp. 3608–3616, Sep. 1987.

Farneth, et al., Influence of Oxygen Stoichiometry on the Structure and Superconducting Transition Temperature of $Yba_2Cu_3O_x$, *Solid State Communications*, vol. 66, No. 9, pp. 953–959, 1988.

Sengupta, et al., Fabrication Of Large Domain $YBa_2Cu_3O_x$ For Magnetic Suspension Applications, Processings of the Third International Conference on Magnetic Suspension Technology, 15 pages, 1995.

Todt, et al., Processing of Single–and Multi–Domain $YBa_2Cu_3O_x$ Bulk Materials for Levitation Applications By $Nd_{1+x}Ba_{2-x}Cu_3O_y$ Seeding, *Applied Superconductivity*, vol. 3, No. 1–3, pp. 175–185, 1995.

Todt, et al., Processing of Large $YBa_2Cu_3O_x$ Domains for Levitation Applications by a $Nd_{1+x}Ba_{2-x}Cu_3O_y$–Seeded Melt–Growth Technique, *Journal of Electronic Materials*, vol. 23, No. 11, pp. 1127–1130, 1994.

Kim, et al., New method of producing fine $Y_2BaCuO_5$ in the melt–textured Y–Ba–Cu–O system: attrition milling of $Yba_2Cu_3O_y$–$Y_2BaCuO_5$ powder and $CeO_2$ addition prior to melting, *Superconductor Science and Technology*, vol. 8, pp. 652–659, 1995.

Acero, et al., Current Limiter Based on Melt Processed YBCO Bulk Superconductors, *IEEE Transactions on Applied Superconductivity*, vol. 5, No. 2, pp. 1071–1074, Jun. 1995.

Meng, et al., Growth and possible size limitation of quality single–grain $YBa_2Cu_3O_7$, *Physica C*, vol. 232, pp. 337–346, 1994.

Frangi, et al., Enhanced levitation properties in melt–textured YBCO samples grown without temperature gradient, *Physica C*, vol. 233, pp. 301–310, 1994.

Allemeh, et al., Effect of High–Temperature, High–Oxygen–Fugacity Annealing on the Stability of the $(Bi, Pb)_2Sr_2Ca_2Cu_3O_{10\pm\delta}$–Type Compound, *J. Am. Ceram. Soc.*, vol. 78, pp. 2513–2520, 1995.

Rothman, et al., Tracer diffusion of oxygen in $YBa_2Cu_3O_{7-\delta}$, *The American Physical Society*, pp. 8852–8860, 1989.

Tu, et al., Diffusion of oxygen in superconducting $YBa_2Cu_3O_{7-\delta}$ceramic oxides, *The American Physical Society*, pp. 304–314, 1989.

Grader, et al., Rates of Change in High Temperature Electrical Resistivity and Oxygen Diffusion Coefficient in $Ba_2YCu_3O_x$, *Applied Physics A*, vol. 45, pp. 179–183, 1988.

Lo, et al., Fabrication of large grain YBCO by seeded peritectic solidification, *J. Mater. Res.*, vol. 11, No. 4, pp. 1–9, Apr. 1996.

Liang, et al., Oxygen Content and Phase Diagram of the High–$T_c$ Superconductor $Ba_2ErCu_3O_y$, *Japanese Journal of Applied Physics*, vol. 27, No. 7, pp. L1277–L1280, Jul. 1988.

*Primary Examiner*—Roy V. King
*Attorney, Agent, or Firm*—Standley & Gilcrest LLP

[57] ABSTRACT

The present invention includes a method of oxygenating an oxide superconductive material having an initial oxygen content, the method comprising the steps: (a) obtaining an oxide superconductive material, the material having an initial oxygen content; and (b) placing the oxide superconductive material in contact an oxygen-containing media having an oxygen chemical potential greater than that of pure diatomic oxygen at 1 atmosphere pressure and at 300° C., and raising the temperature of the oxide superconductive material to a temperature above about 400° C., and maintaining the oxide superconductive material at the temperature and under the chemical potential of oxygen for sufficient time so as to alter the oxygen content of the oxide superconductive material from the initial oxygen content.

13 Claims, 3 Drawing Sheets

P-T-X PHASE DIAGRAM
$S^1$ & $S^2$ = SOLID
L = LIQUID
□—□ DENOTES CRYSTAL PHASE TRANSITION LINE
A-A' IS MELTING CURVE

METHOD FOR OXYGENATING OXIDE SUPERCONDUCTIVE MATERIALS

TECHNICAL FIELD

The present invention is in the field of superconductive materials and their manufacture. This invention relates to the high temperature/high pressure oxygenation of high temperature superconducting oxide precursors.

BACKGROUND

The superconducting properties of oxide superconductors can be greatly influenced by the oxygen content within these oxides. The first oxide superconductor found to possess a critical temperature in excess of the boiling point of liquid nitrogen, 77° K, is $YBa_2Cu_3O_{7-y}$. The $YBa_2Cu_3O_{7-y}$ compound can possess oxygen contents ranging from about $YBa_2Cu_3O_{6.05}$ (y≈0.95) to about $YBa_2Cu_3O_{6.95}$ (y≈0.05). See R. Bormann, J. Nolting, "Stability Limits of the Perovskite Structure in the Y—Ba—Cu—O System," *Applied Physics Letters*, Vol. 54, No. 21, pg. 2148 (1989); T. B. Lindemer, J. F. Hunley, J. E. Gates, A. L. Sutton, Jr., J. Brynestad, C. R. Hubbard, P. K. Gallagher, "Experimental and Thermodynamic Study of Nonstoichiometry in <$YBa_2Cu_3O_{7-x}$>," *Journal of the American Ceramic Society*, Vol. 72, No. 10, pg. 1775 (1989); and J. D. Jorgensen, M. A. Beno, D. G. Hinks, L. Soderhold, K. J. Volin, R. L. Hitterman, J. D. Grace, I. K. Schuller, C. U. Segre, K. Zhang, M. S. Kleefisch, "Oxygen Ordering and the Orthorhombic-to-Tetragonal Phase Transition in $YBa_2Cu_3O_{7-x}$," *Physical Review B*, Vol. 36, No. 7, pg. 3608 (1987). As the oxygen content of $YBa_2Cu_3O_{7-y}$ increases, the critical temperature, $T_c$, also increases to a point where, at compositions of about $YBa_2Cu_3O_{6.9}$, $T_c \geq 85°$ K. See W. E. Farneth, R. K. Bordia, E. M. McCarron III, M. K. Crawford, R. B. Flippen, "Influence of Oxygen Stoichiometry on the Structure and Superconducting Transition Temperature of $YBa_2Cu_3O_x$," *Solid State Communications*, Vol. 66, No. 9, pg. 953 (1988). While Bi—Sr—Ca—Cu—O-bearing and Tl—Ba—Ca—Cu—O-bearing type superconductors possess narrower ranges of oxygen contents, the superconducting properties of these oxides are also dependent on the oxygen concentration.

It is usually desirable to produce a bulk superconductor (e.g., in the form of a wire, tape, pellet, cylinder, thick film, etc.) with a high density (low porosity), so as to maximize the amount of supercurrent that can be carried by the superconductor. Unfortunately, dense, bulk oxide superconductors need to be annealed for prolonged periods of time in contact with an oxygen-bearing media (i.e., any solid, liquid or gas; e.g., pure oxygen or air at ambient pressure) in order to allow for sufficient oxygen diffusion to achieve a desired oxygen content (and hence, a high Tc substantially throughout the bulk of the superconductive oxide).

Partial melt processing (so-called "melt-textured growth" or "top-seeded melt texturing") has yielded bulk forms of $YBa_2Cu_3O_x$ with a high degree of crystallographic alignment. See S. Sengupta, J. Corpus, J. R. Gaines, Jr., V. R. Todt, X. Zhang, D. J. Miller, "Fabrication of Large Domain $YBa_2Cu_3O_x$ for Magnetic Suspension Applications," *Proceedings of the Third International Conference on Magnetic Suspension Technology*, Tallahassee, Fla., 1995; V. R. Todt, S. Sengupta, D. J. Miller, "Processing of Single- and Multi-Domain $YBa_2Cu_3O_x$ Bulk Materials for Levitation Applications by $Nd_{1+x}Ba_{2-x}Cu_3O_y$ Seeding," *Applied Superconductivity*, Vol. 3, No. 1–3, pg. 175 (1995); V. R. Todt, S. Sengupta, D. Shi, P. R. Sahm, P. J. McGinn, R. B. Poeppel, J. R. Hull, "Processing of Large $YBa_2Cu_3O_x$ Domains for Levitation Applications by a $Nd_{1+x}Ba_{2-x}Cu_3O_y$ Seeded Melt-Growth Technique," *Journal of Electronic Materials*, Vol. 23, No. 11, pg. 1127 (1994); and C. -J. Kim, H.- W. Park, K. -B. Kim, G. -W Hong., "New Method of Producing Fine $Y_2BaCuO_5$ in the Melt-Textured Y—Ba—Cu—O System: Attrition Milling of $YBa_2Cu_3O_x$—$Y_2BaCuO_5$ Powder and $CeO_2$ Addition Prior to Melting," *Superconductor Science and Technology*, Vol. 8, pg. 652 (1995). Such melt-processed $YBa_2Cu_3O_x$ has potential use in applications such as bearings, clamps, cryopumps, cryocoolers, cryoflowmeters, energy storage devices (e.g., flywheels), motors, electromagnetic projectiles, vibration isolation, contactless transportation and fault current limiting. See F. C. Moon, *Superconducting Levitation, Applications to Bearings and Magnetic Transportation*, John Wiley & Sons, Inc., 1993; J. R. Hull, R. B. Poeppel, *HTS Materials, Bulk Processing and Bulk Applications*, World Scientific, N.J., pg. 484 1992; S. Sengupta, J. Corpus, J. R. Gaines, Jr., V. R. Todt, X. Zhang, D. J. Miller, "Fabrication of Large Domain $YBa_2Cu_3O_x$ for Magnetic Suspension Applications," *Proceedings of the Third International Conference on Magnetic Suspension Technology*, Tallahassee, Fla., 1995; J. Acero, L. Garcia-Tabares, M. Bajko, J. Calero, X. Granados, X. Obradors, S. Pinol, "Current Limiter Based on Melt Processed YBCO Bulk Superconductors," *IEEE Transactions on Applied Superconductivity*, Vol. 5, No. 2, page 1071 (1995); and R. L. Meng, L. Gao, P. Gaurier-Picard, D. Ramierez, Y. Y. Sun, C. W. Chu, "Growth and Possible Size Limitation of Quality Single-Grain $YBa_2Cu_3O_x$," *Physica C*, Vol. 232, pg. 337 (1994). In the case of bulk, melt-textured $YBa_2Cu_3O_{7-y}$, cylinders having dimensions in the general range of 1.1 to 4.5 cm diameter and 0.5 to 1.6 cm thickness, several days or weeks of annealing in air or oxygen at ambient pressure and at temperatures of 400 to 5000 C are often required to achieve a fully oxygenated component. See S. Sengupta, J. Corpus, J. R. Gaines, Jr., V. R. Todt, X. Zhang, D. J. Miller, "Fabrication of Large Domain $YBa_2Cu_3O_x$ for Magnetic Suspension Applications," *Proceedings of the Third International Conference on Magnetic Suspension Technology*, Tallahassee, Fla., 1995; Private Communication, Dr. S. Sengupta, SCI, Jul. 29, 1996; V. R. Todt, S. Sengupta, D. Shi, P. R. Sahm, P. J. McGinn, R. B. Poeppel, J. R. Hull, "Processing of Large $YBa_2Cu_3O_x$ Domains for Levitation Applications by a $Nd_{1+x}Ba_{2-x}Cu_3O_y$ Seeded Melt-Growth Technique," *Journal of Electronic Materials*, Vol. 23, No 11, pg. 1127 (1994); F. Frangi, E. Varesi, G. Ripamonti, S. Zannella, "Enhanced Levitation Properties in Melt-Textured YBCO Samples Growth Without Temperature Gradient," *Physica C*, Vol. 233, pg. 301 (1994); R. L. Meng, L. Gao, P. Gautier-Ociard, D. Ramnierez, Y. Y. Sun, C. W. Chu, "Growth and Possible Size Limitation of Quality Single-Grain $YBa_2Cu_3O_x$," *Physica C*, Vol. 232, pg. 337 (1994); and K. Sawano, M. Morita, M. Tanaka, T. Sasaki, J K. Kimura, S. Takebayashi, M. Kimura, K. Miyamoto, *Japanese Journal of Applied Physics*, Vol. 30, pg. L1157 (1991). For example, Todt et al. annealed oxygenated melt-textured pellets of dimensions 1.1 to 2.3 cm diameter by 0.8 to 1.6 cm thick for 10 days at 450° C. See V. R. Todt, S. Sengupta, D. Shi, P. R. Sahm, P. J. McGinn, R. B. Poeppel, J. R. Hull, "Processing of Large $YBa_2Cu_3O_x$ Domains for Levitation Applications by a $Nd_{1+x}Ba_{2-x}Cu_3O_y$ Seeded Melt-Growth Technique," *Journal of Electronic Materials*, Vol. 23, No. 11, pg. 1127 (1994). Meng et al. oxygenated 2.5 cm diameter by 1 cm thick cylinders of melt-textured $YBa_2Cu_3O_{7-y}$ at 500° C. in flowing oxygen for 150 to 300 hours (about 6 to 12 days). See R. L. Meng, L. Gao, P. Gautier-Picard, D. Ramierz, Y. Y. Sun, C. W. Chu, "Growth and Possible Size Limitation of Quality Single-Grain $YBa_2Cu_3O_x$," Physica C, vol. 232, pg. 337 (1994). Such long annealing times are unattractive for large-scale manufacturing.

Accordingly, it is desirable to develop processes by which oxide superconductors can be oxygenated in an efficient manner, and with an economic application of energy.

SUMMARY OF THE INVENTION

The present invention includes a method for oxygenating oxide superconductive materials, and superconductive oxide materials made by said method.

In broadest terms, the method of the present invention is based on an oxidation strategy which uses both higher temperatures and an oxygen-bearing media with a higher oxygen chemical potential than is typically used in oxygenation processes of the prior art. One embodiment of the present invention is to use higher temperatures and oxygen-bearing gases at higher oxygen fugacities to increase both oxygen diffusivity and oxygen solubility. The method of the present invention is a method of oxygenating an oxide superconductive material having an initial oxygen content, and comprises the steps: (a) obtaining an oxide superconductive material having an initial oxygen content; and (b) placing the oxide superconductive material in contact with an oxygen-containing media having an elevated oxygen chemical potential greater than that of pure diatomic oxygen at 1 atmosphere pressure and at 300° C., and raising the temperature of the oxide superconductive material to an elevated temperature above about 300° C., and maintaining the oxide superconductive material at that elevated temperature and under that elevated oxygen chemical potential for sufficient time so as to alter the oxygen content of the oxide superconductive material from the initial oxygen content to a final oxygen content at a rate greater than that acheived through exposure to an oxygen-containing media having an oxygen chemical potential less than or equal to that of pure diatomic oxygen at 1 atmosphere pressure and at 300° C., at that elevated temperature.

As used herein, reference to the oxygen chemical potential at the "reference state" shall refer to the oxygen chemical potential of pure diatomic oxygen at 1 atmosphere pressure and at 300° C.

As used herein, the following conversion may be applied in comparing units of pressure: 1 atm≅1.01 bars≅0.101 Mpa≅14.7 lbs./sq. in.

Definitions of Chemical Potential for a Species i and the Fugacity of a Species i The following discussion is presented to define the chemical potential of species i, $\mu_i$, and the fugacity of species i, $f_i$, in a given phase (e.g., a gas, liquid, or solid). Such a discussion can be found in any of several thermodynamics textbooks (e.g., C. H. P. Lupis, Chemical Thermodynamics of Materials, Elsevier Publishing Co., 1983; R. T. DeHoff, Thermodynamics in Materials Science, McGraw-Hill, 1993).

Consider a phase comprised of several species. The Gibbs free energy of this phase is defined by:

$$G = H - TS \quad (1)$$

where H is the enthalpy, T is the absolute temperature (in units of Kelvin), and S is the entropy of the phase. The Gibbs free energy of any given phase is a function of temperature, pressure, and the number of moles of each species in the phase. The chemical potential of species i, $\mu_i$, is defined as the change in the Gibbs free energy resulting from a change in the number of moles of species i in the phase at a fixed temperature and pressure and with a fixed number of moles of other species; that is, $\mu_i = \partial G / \partial n_i$ at fixed T, P, $n_j \ldots n_k$ or, in shorter notation $$\mu_i = \partial G / \partial n_i |_{T, P, nj \ldots nk} \quad (2)$$

where $n_i$ refers to the moles of species i, $n_j \ldots n_k$ refers to the moles of other species present in the phase, and P refers to pressure. The chemical potential of species i in a given phase is itself dependent upon temperature, pressure, and the composition of the phase. It can be shown that the change in the chemical potential of species i with pressure at a fixed temperature and composition is equal to the change in the molar volume of the phase with the number of moles of species i at a fixed temperature, pressure and moles of species j through k; that is, $\partial \mu_i / \partial P |_{T, ni, nj \ldots nk} = \partial V / \partial n_i |_{T, P, nj \ldots nk}$ or $$\partial \mu_i |_{T, ni, nj \ldots nk} = [\partial V / \partial n_i |_{T, P, nj \ldots nk}] \partial P |_{T, ni, nj \ldots nk} \quad (3)$$

where V=volume. Integration of (3) yields:

$$\mu_i(T, P, n_i, n_j \ldots n_k) - \mu_i^*(T, P^*, n_i, n_j \ldots n_k) = \quad (4)$$
$$\int_{P^*}^{P} [\partial V / \partial n_i |_{T,P,nj \ldots nk}] \partial P |_{T,ni,nj \ldots nk}$$

where $\mu_i(T, P, n_i, n_j \ldots n_k)$ and $\mu_i^*(T, P^*, n_i, n_j \ldots n_k)$ refer to the chemical potentials of species i at pressures P and P*, respectively.

Consider, for example, a gaseous phase comprised of only one species i. Such a pure gas is considered to be ideal if the pressure, volume, temperature, and moles of species i are interrelated by the following equation:

$PV = n_i RT$ or $$V = n_i RT/P \quad (5)$$

where R is an ideal gas constant.
Combining equations (3) and (5) yields:

$\partial \mu_i / \partial P |_{T, ni} = RT/P$ or $$\partial \mu_i |_{T, ni} = (RT/P) \partial P |_{T, ni} = RT \partial \ln(P) |_{T, ni} \quad (6)$$

Integration of equation (6) yields the following expression relating the chemical potential of species i to the pressure of the pure ideal gas:

$$\mu_i(T, P) = \mu_i(T, P^*) + RT \ln(P/P^*) \quad (7)$$

where $\mu_i(T, P)$ and $\mu_i(T, P^*)$ refer to the chemical potentials of species i in the pure gas at pressures P and P*, respectively. The state of the gas characterized by temperature T and pressure P* is called the reference state (a reference state for which the pressure P*=1 atm is also known as a standard state). If P*=1 atm, then:

$$\mu_i(T, P) = \mu_i(T, 1\text{ atm}) + RT \ln(P) \tag{8}$$

Equation (8) indicates that the chemical potential of species i in a pure ideal gas, relative to the chemical potential of species i for a standard state, is linearly proportional to the natural logarithm of the gas pressure. For a non-ideal gas or for a condensed phase, equation (5) does not generally apply, so that the chemical potential is generally not linearly related to the logarithm of the pressure (i.e., equation (8) is not generally valid). However, a term known as the fugacity of species i, $f_i$, can be defined as follows for a non-ideal gas or for a condensed phase:

$$\partial \mu_i|_T = RT \partial \ln(f_i)|_T \tag{9}$$

Comparison of equations (6) and (9) indicates that the fugacity of a pure, non-ideal gas is the analog to the pressure of a pure ideal gas. Further, it can be shown that the fugacity of a species i in a non-ideal gas containing numerous gas species is the analog to the partial pressure of species i in an ideal gas, where the partial pressure of gas species i, $p_i$, is defined as follows:

$$p_i = (n_i/n_{tot})P \tag{10}$$

where $n_{tot}$ is the total number of moles of all gas species. Combining equations (3) and (9) yields:

$$\partial \ln(f_i)|_{T, ni, nj \ldots nk} = [(1/RT)\partial V/\partial n_i|_{T, P, nj \ldots nk}]\delta P|_{T, ni, nj \ldots nk} \tag{11}$$

Integration of equation (11) yields:

$$\ln(f_i) - \ln(f_i^*) = \int_{P^*}^{P} [\partial V / \partial n_i|_{T,P,nj\ldots nk}] \partial P|_{T,ni,nj\ldots nk} \tag{12}$$

where $f_i^*$ refers to the fugacity of species i at the reference state pressure $P^*$. Hence, if an expression describing the relationship between the volume, pressure, temperature, and moles of species in a phase is known (a so-called "equation of state"), then the fugacity of species i for a given state of a phase, relative to the fugacity of species i in a reference state, can be obtained from equation (12).

At elevated pressures and temperatures, the equation of state of oxygen-bearing gases, liquids, or solids can deviate from equation (5). For such oxygen-bearing phases, the appropriate equation of state can be inserted into equation (4) so that the chemical potential of oxygen for a given phase state, relative to the chemical potential of oxygen for a reference phase state, can be calculated. Equation (12) can be used in an analogous fashion to calculate the fugacity of oxygen in a phase at a given state relative to the fugacity of oxygen at a reference state.

Calculation of the Oxygen Fugacity in Oxygen-Argon Gas Mixtures at Elevated Temperatures and Pressures Pure oxygen at 1 atmosphere pressure and elevated temperatures (e.g. at temperatures in excess of 400° C.) behaves as a nearly ideal gas. For example, the deviation from ideal behavior of oxygen at 1 atmosphere pressure and 400° C. is less than about 0.02%. S. M. Allameh, K. H. Sandhage, "Effect of High-Temperature, High-Oxygen-Fugacity Annealing on the Stability of the $(Bi,Pb)_2Sr_2Ca_2Cu_3O_{10+\delta}$-type Compound," *Journal of the American Ceramic Society*, Vol. 78, No. 9, pg. 2513 (1995); D. R. Lide (ed.), *CRC Handbook of Chemistry and Physics*, 74th Edition, pp. 6–48 and 6–49, CRC Press, Boca Raton, Fla., 1993. Hence, at ambient pressures at or equal to 400° C., the oxygen fugacity is nearly the same as the total pressure of pure oxygen or the partial pressure of oxygen in air.

However, oxygen and argon each behave strictly as non-ideal gases at elevated pressures (i.e., at P >>1 atm) and temperatures. Nonetheless, the calculations of oxygen fugacity for the oxygen-argon mixtures used in the high-pressure experiments described with respect to embodiments of the present invention were based on the assumption that oxygen-argon mixtures obey the law of ideal mixing. That is, the fugacity of oxygen in an oxygen-argon mixture was assumed to be equal to the fugacity of pure oxygen exposed to a similar pressure and temperature as the mixture multiplied by the fraction of oxygen present in the oxygen-argon mixture. This assumption of ideal mixing of non-ideal oxygen and argon gas species seems reasonable in light of the data of Masson and Dolley (I. Masson and L. G. F. Dolley, "The Pressures of Gaseous Mixtures," Proc. Royal Soc. London, Vol. A103, pp. 524–538, 1923). These authors measured the pressures of equimolar mixtures of oxygen and argon containing varying moles of gas within a fixed volume at room temperature. In separate experiments using the same volume, these authors also measured the pressure of pure oxygen, as well as the pressure of pure argon. The oxygen-argon mixtures were found to exhibit pressures that were within 1.5% of the sum of the pressures obtained for equivalent numbers of moles of pure oxygen and pure argon. Indeed, the percentage difference between the pressure of the gas mixture and the sum of the pressures of pure oxygen and pure argon (i.e., the deviation from ideal mixing) remained small and relatively constant (1.2%–1.5%) for elevated pressures in the range of 6.1 to 12.7 MPa (i.e., from about 60 to about 125 atmospheres).

The fugacity of pure oxygen at a particular temperature and elevated pressure can be determined through the integration of equation (11) with an appropriate reference state and equation of state. For pure oxygen, the following van der Waals equation of state can be used (Handbook of Chemistry and Physics, ed. R. C. Weast, 55th Edition, CRC Press, 1974, pg. D-157):

$$[P+(1.360/VO_2^2)][VO_2-0.03183] = 0.08206T \tag{13}$$

where P=pressure in units of atmospheres, $VO_2$=molar volume of oxygen (the total volume divided by the moles of oxygen) in units of liters/mole, and T=temperature on the Kelvin scale. Insertion of equation (13) into equation (12) and integration yields:

$$\ln[fO_2/P] = \ln\{0.08206T/[P(VO_2-0.03183)]\} - [33.15/(T(VO_2))] + [0.03183/(VO_2-0.03183)] \tag{14}$$

The use of equation (14) assumes that the fugacity of oxygen becomes equal to the pressure of pure oxygen at modest pressures; that is, the fugacity of pure oxygen at 1 atm pressure is set equal to 1 atm. Equation (13) can be used to calculate the molar volume of pure oxygen at a particular temperature and pressure. The temperature, pressure, and molar volume of pure oxygen can then be inserted into equation (14) to calculate the fugacity of pure oxygen, $fO_2$. The fugacity of oxygen in the oxygen-argon mixture can then be obtained by multiplying $fO_2$ by the fraction of oxygen in the mixture. See S. M. Allameh et al, supra.

Accordingly, the present invention may be expressed in terms of oxygen chemical potential or oxygen fugacity with mention of any given reference state, such as referencing the chemical potential of oxygen under certain conditions to that of pure (diatomic) oxygen at 1 atmosphere pressure and at 3000 C.

In broadest terms, the present invention includes a method of oxygenating an oxide superconductive material having an initial oxygen content, the method comprising the steps: (a) obtaining an oxide superconductive material having an initial oxygen content; and (b) placing the oxide superconductive material in contact with an oxygen-containing media having an oxygen chemical potential greater than that of pure oxygen at 1 atmosphere pressure and at 300° C., and raising the temperature of the oxide superconductive material to a temperature above about 300° C., and maintaining said oxide superconductive material at that temperature and under such chemical potential of oxygen for sufficient time so as to oxygenate the oxide superconductive material to a desired level (which may be above or below the initial oxygen level, but typically will be above).

One of the novel features of the present invention is the use of relatively higher oxygen fugacities to access higher temperatures for much higher oxygen fluxes, and much shorter annealing times, for the complete oxygenation of superconductive oxides. Such superconductive oxides may include rare earth-bearing superconductive oxides, such as RE—Ba—Cu—O-types (as used herein, "RE" refers to rare earth metals such as Yttrium, Ytterbium, Erbium, Europium, Gadolinium, Holmium and Neodymium), Bi—Sr—Ca—Cu—O-bearing types, Hg—Ba—Ca—Cu—O-bearing and Tl—Ba—Ca—Cu—O-bearing types. $YBa_2Cu_3O_{7-y}$ is referred to hereinafter as an example of a superconductive oxide to which the invention might be applied. Such completed altered oxygenation is required to maximize the critical temperature and critical current density of such an oxide superconductor.

In preferred embodiments, step (b) of the method of the present invention may be carried out at even higher temperatures such as those above 600° C., or even those above 700° C. Most preferably, step (b) of the method of the present invention may be carried out at oxygen chemical potentials which are at least about twice the oxygen chemical potential of pure oxygen at 1 atmosphere pressure and at 300° C., and may be as high as at least about one hundred times the oxygen chemical potential of pure oxygen at 1 atmosphere pressure and at 300° C. For example, pure oxygen at 2 atmospheres, or as high as above 100 atmospheres, may be used.

The method of the present invention may be carried out using oxygen-bearing media in a physical form selected from the group consisting of plasma, gas, liquid, solid or mixtures thereof. The enhanced oxygen chemical potential is achieved by application of energy from electrical, chemical or mechanical sources, or a combination thereof. An example is through the application of mechanical force to compress an oxygen bearing gas.

The method of the present invention may be carried out using any oxide-bearing superconductive material, such as, but not limited to, those selected from types in the group consisting of RE—Ba—Cu—O-bearing (such as types in the group consisting of $YBa_2Cu_3O_{7-y}$), Bi—Sr—Ca—Cu—O-bearing types and Tl—Ba—Ca—Cu—O-bearing types. The method of the present invention also may be carried out using any precursor oxide so as to yield oxide superconductive materials of the types $YBa_2Cu_3O_x$, $Y_2Ba_4Cu_7O_x$, $YBa_2Cu_4O_x$ $(Bi,Pb)_2Sr_2CaCu_2O$, or $Hg_1Ba_2Cu_1O_x$ wherein x is sufficient to provide an oxide superconductive material having a $T_c$ greater than 77° K. The method of the present invention also may be carried out using any precursor oxide so as to yield oxide superconductive materials of the types $Bi_2Sr_2Ca_2Cu_3O_x$, $(Bi,Pb)_2Sr_2Ca_2Cu_3O_x$, $HgBa_2Ca_2Cu_3O_x$, $Hg_1Ba_2Ca_1Cu_2O_x$, $(Tl,Pb)_1Sr_2Ca_1Cu_2O_x$ or $(Tl,Pb)_1Sr_2Ca_2Cu_3O_x$, wherein x is sufficient to provide an oxide superconductive material having a $T_c$ greater than 100° K.

This method of the present invention is capable of yielding a much faster rate of oxygenation of bulk oxide superconductors.

Finally, the present invention includes an oxide superconductive material prepared in accordance with the method the present invention.

DETAILED DESCRIPTION OF THE PREFERRED EMBODIMENTS

In accordance with the foregoing summary of the invention, the following presents a detailed description of one embodiment of the present invention, which is presently considered to be the best mode of the present invention in the described application.

The oxygenation method of the present invention was conducted on disks of melt-textured $YBa_2Cu_3O_{7-y}$, commercially available from Superconductive Components, Inc. of Columbus, Ohio.

The method of the present invention may be used to oxygenate $YBa_2Cu_3O_{7-y}$ to a point where the content of elemental oxygen is brought to a coefficient above about 6.85 (i.e., 7−y=6.85) in less than about 5 hours (for a dense, melt-textured cylinder of 1 cm diameter and 4 mm thick). In comparison, oxygenation of dense $YBa_2Cu_3O_{7-y}$ cylinders of similar dimensions to these same levels using prior art methods generally requires longer annealing times.

Figure 1:
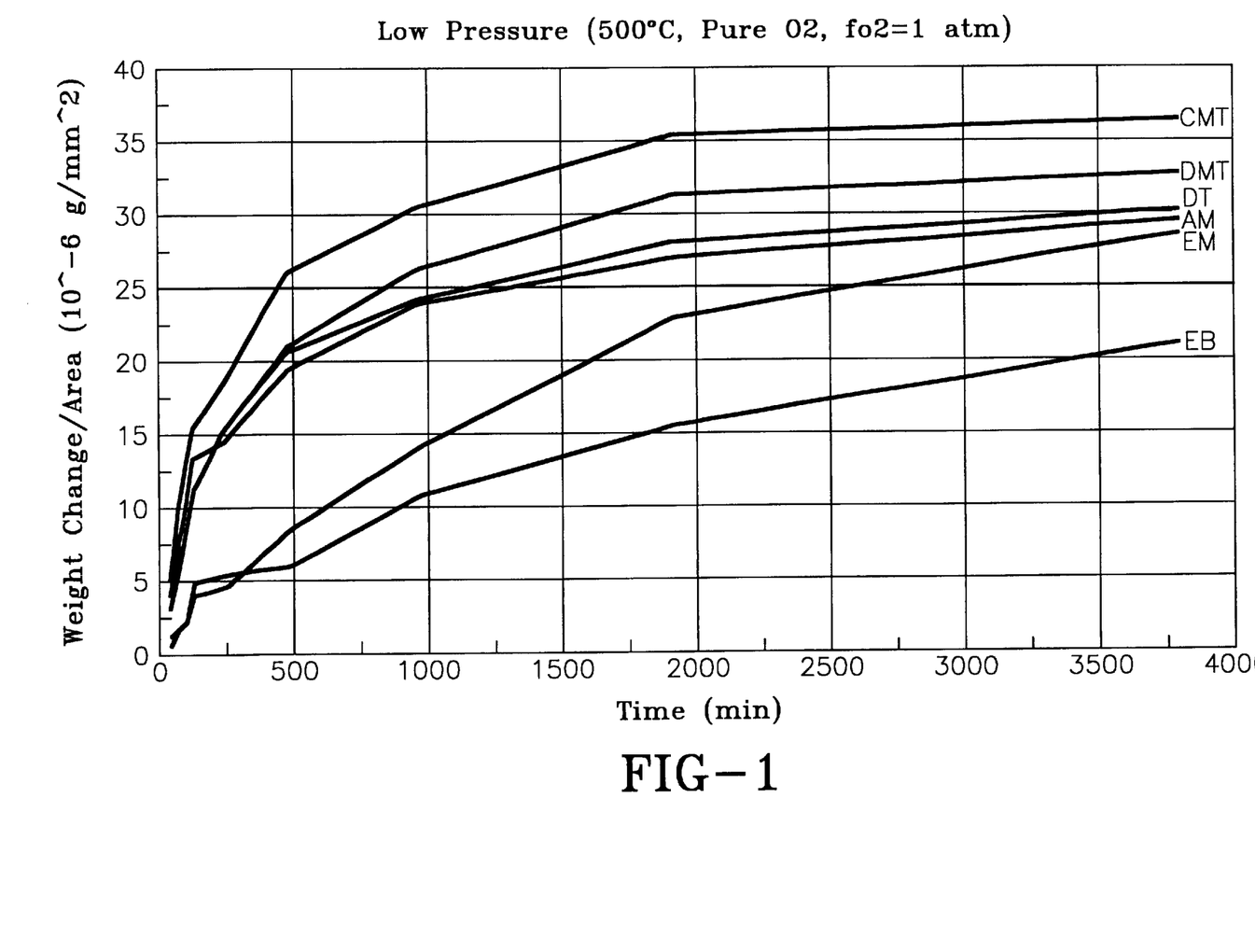
FIG. 1 is a graph of weight change per area versus time showing the progress of oxygenation of an oxide type superconductor in accordance with a method of the prior art.
Figure 2:
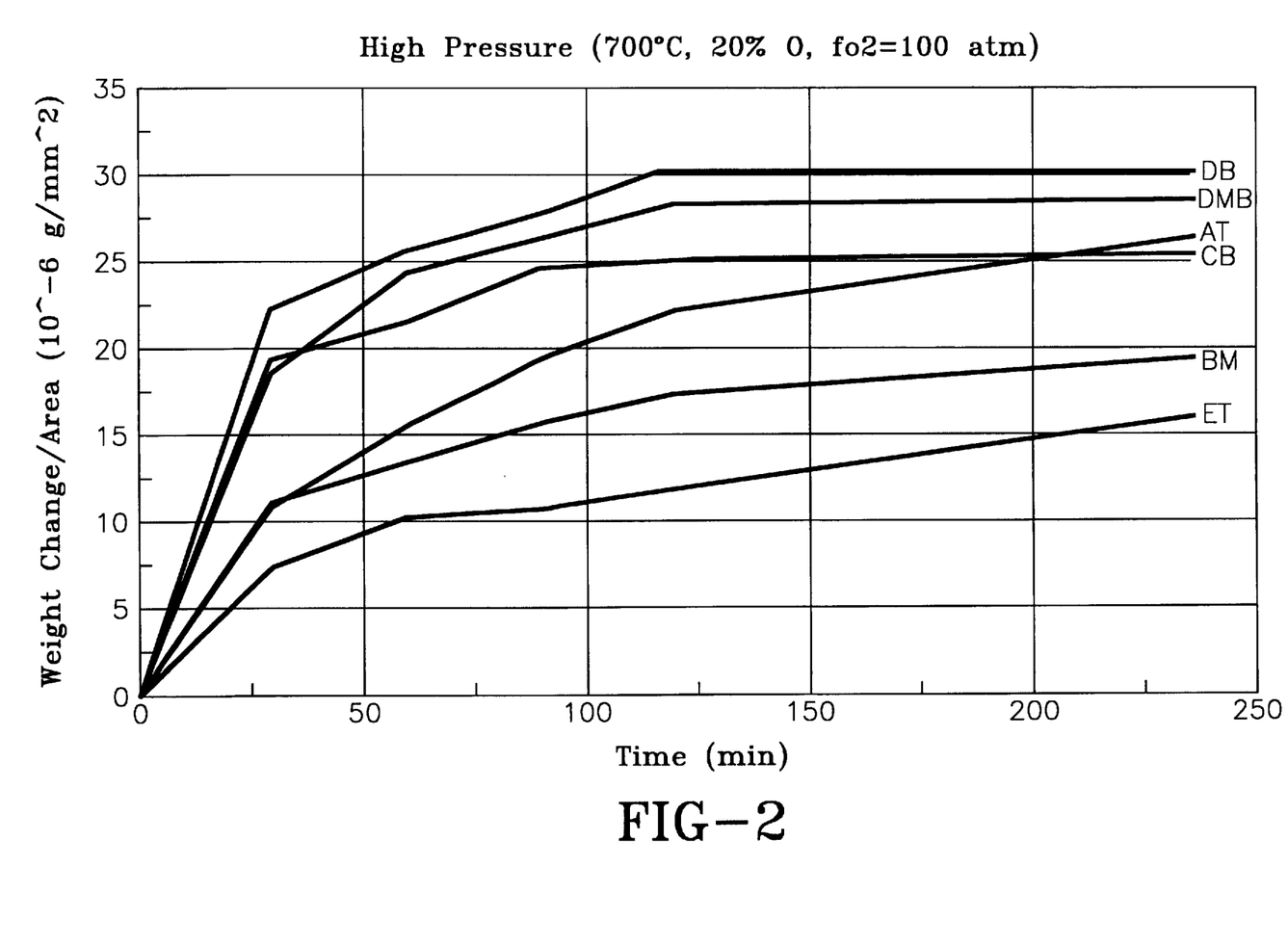
FIG. 2 is a graph of weight change per area versus time showing the progress of oxygenation of an oxide type superconductor in accordance with the present invention.

FIGS. 1 and 2 are graphs which, together with the data presented in Table 1, confirm the enhancement in oxygenation rate with high pressure and temperature achieved in the method of the present invention. Table 1 shows the dimensions, and initial and final (oxygenated) weights of 12 melt-textured $YBa_2Cu_3O_{7-x}$ samples. The letters A, B, C, D, and E refer to particular melt-textured pellets (i.e., 5 different melt-textured pellets were examined). T, M, MT, MB, and B refer to the positions through the thickness within a given pellet from which specimens were cut; that is, T=top section, M=middle section, MT=section between middle and top, MB—section between middle and bottom, and B=bottom section. Hence, D-T, D-MT, D-MB, and D-B refer to 4 disk-shaped samples cut from various positions within the D melt-textured pellet. The top six samples in Table 1 (2716SSA-M to 2764SSE-B) were exposed to pure oxygen at 1 atm pressure at 500° C. ($fO_2$≈1 atm). This is a typical (conventional) heat treatment for oxygenating $YBa_2Cu_3O_{7-x}$ specimens. The bottom six samples in the table (2716SSA-T to 2764SSE-T) were exposed to a 20%$O_2$/80% Argon gas mixture at high pressure (total pressure equals 463 atm) at 700° C. ($fO_2$≈100 atm). This is an example of the oxygenation heat treatment of the present invention. Both heat treatments were applied to different sections of a given melt-textured pellet (e.g., A-M was exposed to the low-oxygen-fugacity treatment, whereas A-T was applied to the high-oxygen-fugacity treatment), in order to minimize experimental variations due to any starting differences between melt-textured pellets.

Plots of the degree of oxygenation, obtained by measuring the weight change per unit surface area of a given specimen, versus heat treatment time are shown in the graphs in FIGS. 1 and 2, for the conventional and the inventive high-fO$_2$ heat treatments, respectively. While there is some scatter in the data for different pellets, comparison of the two graphs clearly indicates that sections cut from a given melt-textured pellet that were exposed to the high-oxygen-fugacity treatment always required less time to achieve a given degree of oxygenation than for sections of the same pellet exposed to the low-oxygen fugacity treatment. For example, the time required to reach $\Delta m/A$ values of 28 to $30 \times 10^{-6}$ g/mm$^2$ for the D-B and D-MB specimens at 700° C. and fO$_2 \approx 100$ atm was about 120 minutes. In order to reach comparable values of $\Delta m/A$ (i.e., 28 to $32 \times 10^{-6}$ g/mm$^2$) at 500° C. and fO$_2 \approx 1$ atm, the D-MT and D-T specimens required about 2000 minutes. This data clearly indicates that higher rates of oxygenation can be achieved with high-oxygen-fugacity, high-temperature heat treatments.

oxygenate bulk YBa$_2$Cu$_3$O$_{7-y}$ bodies with thicknesses in excess of one centimeter. Due to lower oxygen solubility, the prior art methods have not used final oxygenation temperatures substantially in excess of 500° C.

Figure 3:
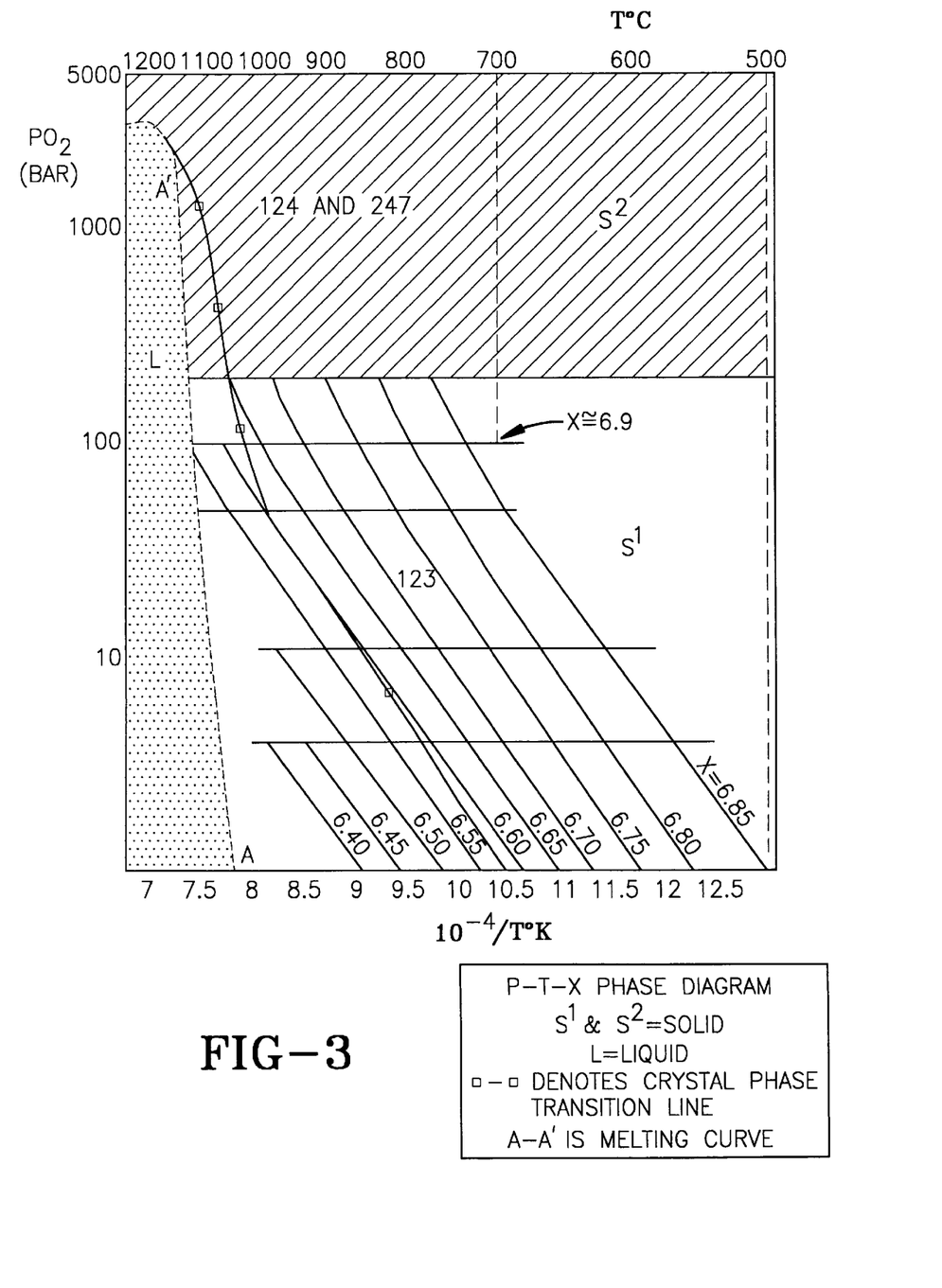
FIG. 3 is a plot of oxygen pressure ($PO_2$) vs. 1/T.

In order to allow for more rapid oxygen diffusion and a high oxygen solubility in superconductive oxides such as YBa$_2$Cu$_3$O$_{7-y}$, a novel high-oxygen-fugacity heat treatment process is brought about through the method of the present invention. This method is effective by taking advantage of the effect of oxygen pressure on the oxygen solubility in YBa$_2$Cu$_3$O$_{7-y}$. According to the enclosed plot in FIG. 3, at 100 bars of oxygen pressure at 700° C., the oxygen solubility corresponds to an oxygen content of >YBa$_2$Cu$_3$O$_{6.8.5}$. In other words, slightly more oxygen can be incorporated into YBa$_2$Cu$_3$O$_{7-y}$ at 700° C. at an oxygen pressure of 100 bars relative to 500° C. at an oxygen pressure of 1 bar (ambient pressure). The benefit gained by operating at 700° C. and 100 bars of oxygen pressure is a tremendous enhancement in the rate of oxygen migration through YBa$_2$Cu$_3$O$_{7-y}$. The rate of oxygen migration can be described by Fick's first law:

$$J_O = -D_O \partial C_O / \partial X \tag{15}$$

TABLE 1

| Number | Thickness (mm) | Diameter (mm) | Initial Weight(g) | Final Weight(g) | High/Low PO2 | Time(min) |
|---|---|---|---|---|---|---|
| 2716SSA-M | 1.06 | 10.70 | 0.5454 | 0.5506 | Low | 3840 |
| 2764SSC-MT | 1.05 | 10.72 | 0.4735 | 0.4793 | Low | 3840 |
| 2764SSD-T | 0.97 | 10.43 | 0.4770 | 0.4822 | Low | 3840 |
| 2764SSD-MT | 1.04 | 10.48 | 0.5211 | 0.5268 | Low | 3840 |
| 2764SSE-M | 1.05 | 10.75 | 0.5302 | 0.5356 | Low | 3840 |
| 2764SSE-B | 1.08 | 10.95 | 0.5974 | 0.6014 | Low | 3840 |
| 2716SSA-T | 1.05 | 10.62 | 0.5674 | 0.5721 | High | 240 |
| 2764SSB-M | 0.89 | 10.98 | 0.3922 | 0.3956 | High | 240 |
| 2764SSC-B | 0.99 | 10.95 | 0.5420 | 0.5468 | High | 240 |
| 2764SSD-MB | 1.05 | 10.54 | 0.5378 | 0.5428 | High | 240 |
| 2764SSD-B | 1.05 | 10.76 | 0.5289 | 0.5343 | High | 240 |
| 2764SSE-T | 0.98 | 10.70 | 0.5166 | 0.5195 | High | 240 |

To understand the process of the present invention, reference may be made to the plot of oxygen pressure (PO$_2$) vs. 1/T. This plot was taken from: J. Karpinski, E. Kaldis, E. Jiolek, S. Rusiecki, B. Bucher, *Bulk Synthesis of the 81 K Superconductor YBa$_2$Cu$_4$O$_8$ at High Oxygen Pressure*, Nature, Vol. 336, Dec. 15, 1988, pg. 660. According to this plot, at 1 bar (~1 atm) of oxygen pressure, temperatures $\leq 500°$ C. are required in order to achieve an oxygen content of $\geq$YBa$_2$Cu$_3$O$_{6.85}$. At a higher temperature (>>500° C.) and at ambient pressure, the oxygen solubility is reduced, although the oxygen diffusivity (not shown in the plot) is enhanced. See S. J. Rothman, J. L. Routbort, J. E. Baker, "Tracer Diffusion of Oxygen in YBa$_2$Cu$_3$O$_{y-\partial}$," *Physical Review B.*, Vol. 400, pg. 8852 (1989); K. N. Tu, N. C. Yeh, S. I. Park, C. C. Tsuei, "Diffusion of Oxygen in Superconducting YBa$_2$Cu$_3$O$_{y-\partial}$ Ceramic Oxides," *Physical Review B*, Vol. 39, pg. 304 (1989); and G. S. Grader, P. K. Gallagher, J. Tomson, M. Gurvitch, "Rates of Change in High Temperature Electrical Resistivity and Oxygen Diffusion Coefficient in Ba$_2$YCu$_3$O$_x$," *Applied Physics A*, Vol. 45, pg. 179 (1988). Hence, an engineering trade-off is usually made to oxygenate superconductive oxides such as YBa$_2$Cu$_3$O$_{7-y}$. In the prior art methods, final temperatures of 400° to 500° C. in pure oxygen at 1 atm pressure are often chosen, as such conditions yield a relatively high oxygen solubilities and modest oxygen diffusivities. Unfortunately, the oxygen diffusivity at less than or equal to 500° C. in dense superconductive oxides such as YBa$_2$Cu$_3$O$_{7-y}$ is sufficiently slow that hundreds of hours of annealing may be required to fully where $J_O$ is the oxygen flux (moles/cm$^2$sec), $D_O$ is the oxygen diffusivity (cm$^2$/sec) and $C_O$ is the oxygen concentration (moles/cm$^3$) at position X. Since oxygen diffusion through YBa$_2$Cu$_3$O$_{7-y}$ is thermally activated and follows an Arrhenius temperature dependence (see S. J. Rothman et al., K. N. Tu et al., and G. S. Grader et al. supra), a linear increase in temperature results in an exponential increase in Do. According to the present invention, because the solubility of oxygen in YBa$_2$Cu$_3$O$_{7-y}$ at 700° C. at 100 bars of oxygen pressure is actually slightly higher than at 500° C. at 1 bar of oxygen pressure, the oxygen concentration gradient in YBa$_2$Cu$_3$O$_{7-y}$ at the initial stage of oxygenation is likely to be slightly higher under the former condition. The large increase in D$_O$ associated with an increase in temperature from 500 to 700° C. results in a large increase in the oxygen flux, J$_O$. This means that by annealing at 700° C. at 100 bars of oxygen pressure, a much shorter time should be required to fully oxygenate a bulk YBa$_2$Cu$_3$O$_{7-y}$ component than is required by more conventional, ambient pressure annealing (e.g., at 500° C. and 1 bar of oxygen pressure).

The novelty of the present invention is the use of high oxygen fugacities to access higher temperatures for much higher oxygen fluxes, and much shorter annealing times, for the complete oxygenation of YBa$_2$Cu$_3$O$_{7-y}$. Such complete oxygenation is required to maximize the critical temperature and critical current density of such an oxide superconductor.

In another test of the method of the present invention, a rectangular pellet of melt-textured YBa$_2$Cu$_3$O$_{7-y}$ was obtained from Superconductive Components, Inc.

(Columbus, Ohio). The pellet was composed of about 75 wt % $YBa_2Cu_3O_{7-y}$ and about 25 wt % $Y_2BaCuO_5$ (the latter phase is added to allow for pinning of the positions of magnetic field lines during use of the superconductor). The pellet was first exposed to 650° C. at an oxygen pressure of ≦900 ppm, so as to homogenize and equilibrate the pellet to a low oxygen content. After about 20 hours, the pellet weight had decreased and had leveled off to a constant value. Equilibration under these conditions should have yielded an oxygen content equivalent to about $YBa_2Cu_3O_{6.20}$. The pellet was then exposed to 700° C. in a high pressure vessel containing a 20% $O_2$/80% Ar gas mixture maintained at a pressure of 7500 psi. This condition corresponds to an oxygen fugacity of about 114 atm. The pellet possessed a thickness of about 4 mm and starting weight of 1.3761 g prior to the high pressure annealing. The weight change of the specimen was recorded after various times as shown in table 2.

TABLE 2

| Annealing Time (hours at 700° C., 114 atm oxygen fugacity) | Weight (g) | Weight Change (g) | % Weight Change | Calculated Composition |
|---|---|---|---|---|
| 0 | 1.3761 | 0 | 0 | $YBa_2Cu_3O_{6.20}$ |
| 2 | 1.39231 | 0.0162 | 1.18 | $YBa_2Cu_3O_{6.84}$ |
| 7 | 1.3935 | 0.0174 | 1.26 | $YBa_2Cu_3O_{6.89}$ |
| 17 | 1.3940 | 0.0179 | 1.30 | $YBa_2Cu_3O_{6.91}$ |
| 37 | 1.3953 | 0.0192 | 1.40 | $YBa_2Cu_3O_{6.96}$ |

After only 2 hours under this novel heat treatment condition, the pellet achieved an oxygen content equivalent to about $YBa_2Cu_3O_{6.84}$. Such an oxygen content is usually sufficient to yield a $T_c$ value in excess of 77° K. Higher oxygen contents were then obtained after 35 additional hours of annealing. It is important to note that even 37 hours is a relatively short time compared to the annealing times that are usually required with conventional heat treatments (e.g., 400 to 500° C. in pure oxygen at ambient pressure for specimens of comparable dimensions; See Private Communication, Dr. S. Sengupta, SCI, Jul. 29, 1996; C. -Jim Kim et al. supra; and F. Frangi et al. supra.

The basic concept of the present invention is to conduct heat treatments at elevated temperatures (e.g., ≧500° C.) and elevated oxygen fugacities (>1 atm) so as to enhance both the oxygen diffusivity and oxygen solubility in oxide superconductors. This heat treatment scheme can be applied to all oxide superconductors (i.e., not just $YBa_2Cu_3O_{7-y}$) so as to greatly reduce the processing times required to obtain desired oxygen contents and desired superconducting properties.

In view of the foregoing disclosure, it may be within the ability of one of ordinary skill to make alterations or modifications to the present invention, such as through the substitution of equivalent materials or process steps, so as to be able to practice the present invention without departing from its spirit as reflected in the appended claims.

What is claimed is:

1. A method of oxygenating an oxide superconductive material having an initial oxygen content, said method comprising the steps:

(a) obtaining an oxide superconductive material, wherein said oxide superconductive material comprises a compound having a formula selected from the group consisting of $YBa_2Cu_3O_x$ and $Y_2Ba_4Cu_7O_x$, said material having an initial oxygen content; and (b) placing said oxide superconductive material in contact with an oxygen-containing media having an oxygen chemical potential greater than that of pure oxygen at 1 atmosphere pressure and at 300 degrees C, said oxygen chemical potential being achieved by application of energy from a mechanical or chemical source, and raising the temperature of said oxide superconductive material to a temperature above about 400 degrees C, and maintaining said oxide superconductive material at said temperature and under said chemical potential of oxygen for sufficient time so as to oxygenate said oxide superconductive material to a level above said initial oxygen content, wherein said oxygenation occurs without substantial change in the ratio of non-oxygen cations and anions.

2. A method according to claim 1 wherein said oxygen content of said oxide superconductive material is altered to a level above said initial oxygen content.

3. A method according to claim 1 wherein said oxygen content of said oxide superconductive material is altered so as to obtain an oxide superconductive material having a Tc above 77° K.

4. A method according to claim 1 wherein said temperature in step (b) is above 600° C.

5. A method according to claim 1 wherein said temperature in step (b) is above 600° C. and wherein said oxygen-containing media in step (b) comprises oxygen at a chemical potential higher than pure diatomic oxygen at a pressure of 1 atmosphere and 300° C.

6. A method according to claim 1 wherein said chemical potential of oxygen is above about 2 times that of pure diatomic oxygen at a pressure of 1 atmosphere and 300° C.

7. A method according to claim 1 wherein said chemical potential of oxygen is above about 100 times that of pure diatomic oxygen at a pressure of 1 atmosphere and 300° C.

8. A method according to claim 1 wherein said oxygen-bearing media is in a physical form selected from the group consisting of plasma, gas, liquid, solid or mixtures thereof.

9. A method according to claim 1 wherein said oxygen chemical potential is achieved by application of energy from chemical sources.

10. A method according to claim 1 wherein said oxygen chemical potential is achieved by application of mechanical force to compress an oxygen bearing gas.

11. A method according to claim 1 wherein said oxide superconductive material comprises a compound having a formula of $YBa_2Cu_3O_x$.

12. A method according to claim 1 wherein said oxide superconductive material having a level of oxygen above said initial oxygen content comprises $YBa_2Cu_3O_x$, wherein x is sufficient to provide an oxide superconductive material having a $T_c$ greater than 77° Kelvin.

13. A method according to claim 1 wherein said oxide superconductive material having a level of oxygen above said initial oxygen content comprises $Y_2Ba_4Cu_7O_x$, wherein x is sufficient to provide an oxide superconductive material having a $T_c$ greater than 77° Kelvin.

* * * * *

UNITED STATES PATENT AND TRADEMARK OFFICE
CERTIFICATE OF CORRECTION

PATENT NO. : 6,153,561
DATED : November 28, 2000
INVENTOR(S) : Kenneth H. Sandhage Page 1 of 1

It is certified that error appears in the above-identified patent and that said Letters Patent is hereby corrected as shown below:

Column 2,
Line 36, please delete the number "5000" and insert -- 500° --;
Line 52, please delete the name "Ramnierez" and insert the name -- Ramierez --;

Column 3,
Line 48, please delete the initials "Mpa" and insert the initials -- MPa --;

Column 6,
Lines 5 and 6, please delete the word "fligacity" and insert the word -- fugacity --;
Line 67, please delete the number "3000" and insert -- 300° --;

Column 7,
Line 61, please delete "(Bi, Pb)$_2$Sr$_2$CaCu$_2$O" and insert -- (Bi, Pb)$_2$Sr$_2$CaCu$_2$O$_x$ --;

Signed and Sealed this

Twenty-fifth Day of September, 2001

Attest:

*Attesting Officer*

NICHOLAS P. GODICI
*Acting Director of the United States Patent and Trademark Office*